United States Patent
Jang

(10) Patent No.: US 11,581,499 B2
(45) Date of Patent: Feb. 14, 2023

(54) DISPLAY DEVICE AND METHOD OF MANUFACTURING THE SAME

(71) Applicant: Samsung Display Co., Ltd., Yongin-si (KR)

(72) Inventor: Min Sok Jang, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 16/997,324

(22) Filed: Aug. 19, 2020

(65) Prior Publication Data

US 2021/0057660 A1 Feb. 25, 2021

(30) Foreign Application Priority Data

Aug. 20, 2019 (KR) ........................ 10-2019-0101524

(51) Int. Cl.
*H01L 51/00* (2006.01)
*H01L 51/52* (2006.01)

(52) U.S. Cl.
CPC .......... *H01L 51/0097* (2013.01); *H01L 51/52* (2013.01); *H01L 2251/5338* (2013.01)

(58) Field of Classification Search
CPC .................................................. H01L 51/0097
See application file for complete search history.

(56) References Cited

U.S. PATENT DOCUMENTS

| 10,368,452 | B2 | 7/2019 | Yun et al. |
| 2016/0357318 | A1 | 12/2016 | Chan et al. |
| 2018/0010621 | A1 | 1/2018 | Niyama et al. |
| 2018/0373297 | A1 | 12/2018 | Liao et al. |

FOREIGN PATENT DOCUMENTS

| KR | 10-2016-0144912 | 12/2016 |
| KR | 10-2018-0062271 | 6/2018 |
| KR | 10-2018-0079016 | 7/2018 |

*Primary Examiner* — Vip Patel
(74) *Attorney, Agent, or Firm* — H.C. Park & Associates, PLC

(57) ABSTRACT

A display device has a first non-foldable area, a second non-foldable area spaced apart from the first non-foldable area, and a foldable area disposed between the first non-foldable area and the second non-foldable area. The display device includes: a support member; a first adhesive layer disposed on the support member; a buffer member disposed on the first adhesive layer; a second adhesive layer disposed on the buffer member; and a flexible display panel disposed on the second adhesive layer. At least one of the support member and the buffer member includes a first area overlapping the foldable area having at least one first uneven area to facilitate bending, the at least one first uneven area being formed on a surface of the first area.

20 Claims, 8 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2019-0101524, filed on Aug. 20, 2019, which is hereby incorporated by reference for all purposes as if fully set forth herein.

BACKGROUND

Field

Exemplary implementations of the invention relate generally to a display device and a method of manufacturing the display device, and more specifically, to a foldable display device and a method of manufacturing the foldable display device.

Discussion of the Background

Recently, as the technology improves, display products having smaller sizes, lighter weights, and superior performance have been produced. Conventional cathode ray tube (CRT) televisions have been widely used for display devices with many advantages in terms of performance and price. Recently, however, a display device such as a plasma display device, a liquid crystal display device, and an organic light emitting display device has been spotlight because it overcomes weak points of the CRT in terms of miniaturization or portability and has advantages such as miniaturization, light weight, low power consumption, etc.

Recently, various types of display devices other than flat display devices have been developed. For example, various flexible display devices such as curved display devices, bendable display devices, foldable display devices, rollable display devices, and stretchable display devices have been developed. In particular, a foldable display device that is bi-directionally foldable about a foldable axis has been developed.

The above information disclosed in this Background section is only for understanding of the background of the inventive concepts, and, therefore, it may contain information that does not constitute prior art.

SUMMARY

Applicant realized that in the case of foldable display devices, the stress in a foldable area may be higher than that in a non-foldable area, and thus defects such as delamination of a layer structure, bubbles, etc., may occur in the foldable area of the foldable display device Display devices constructed according to the principles and exemplary implementations of the invention and exemplary methods of manufacturing same according to the principles of the invention prevent or at least reduce defects caused by repeated folding and unfolding of the display device. For example, the display device may include at least one uneven area to facilitate folding and thereby prevent or at least reduce defects in a foldable area and/or in a non-foldable area adjacent to the foldable area.

Additional features of the inventive concepts will be set forth in the description which follows, and in part will be apparent from the description, or may be learned by practice of the inventive concepts.

According to one aspect of the invention, a display device having a first non-foldable area, a second non-foldable area spaced apart from the first non-foldable area, and a foldable area disposed between the first non-foldable area and the second non-foldable area, the display device includes: a support member; a first adhesive layer disposed on the support member; a buffer member disposed on the first adhesive layer; a second adhesive layer disposed on the buffer member; and a flexible display panel disposed on the second adhesive layer. At least one of the support member and the buffer member includes a first area overlapping the foldable area having at least one first uneven area to facilitate bending, the at least one first uneven area being formed on a surface of the first area.

The support member may include a lower plate including: a first metal layer; a film layer disposed on the first metal layer, the film layer including the first area; and a second metal layer disposed on the film layer.

The buffer member may include a cushion panel including a second area overlapping the foldable area, the second area having at least one second uneven area to facilitate bending. The first area may have a first width. The second area may have a second width greater than the first width.

The first and second areas may include first and second wrinkled areas having wrinkles formed on a surface of the film layer and the cushion panel, respectively, and the second area of the cushion panel may partially overlap the first and second non-foldable areas.

The lower plate may further include: a lower adhesive layer disposed between the first metal layer and the film layer; and an upper adhesive layer disposed between the film layer and the second metal layer.

The support member may include a film layer including the first area, and the film layer of the support member may include a resin layer having a conductive ball.

The first area may include a wrinkled area having wrinkles formed on top and bottom surfaces thereof.

The first and second adhesive layers may include third and fourth areas overlapping the foldable area, at least one of the third and fourth areas having at least one uneven area to facilitate folding.

The first area may include fine particles containing calcium carbonate.

According to another aspect of the invention, a method of manufacturing a display device includes steps of: forming a film layer by using a resin solution containing fine particles having basicity; performing an acid-treatment to remove some of the fine particles adjacent to a surface of the film layer by allowing an acidic solution to contact the film layer; forming a wrinkle on the surface of the film layer by curing the acid-treated film layer; and attaching a display panel onto the film layer having the wrinkle.

The fine particles may contain calcium carbonate ($CaCO_3$).

Surfaces of the fine particles may be subject to a hydrophobic treatment.

The hydrophobic treatment may be performed by mixing the fine particles containing the calcium carbonate ($CaCO_3$) with ethanol and stearic acid.

The acidic solution may include dilute hydrochloric acid.

The film layer may be thermally cured at a temperature of more than about 100° C. when the acid-treated film layer is cured.

The fine particles may have an average size of less than about 0.1 μm.

The method may further include the step of: attaching a metal plate onto the film layer before the display panel is attached onto the film layer.

The method may further include the step of: attaching a cushion panel onto the metal plate before the display panel is attached onto the film layer.

The film layer may include a wrinkled area having the wrinkle and flat areas spaced apart from each other, and the wrinkled area may be formed between the flat areas.

According to still another aspect of the invention, a display device includes: a flexible display panel having a foldable area; and a film layer disposed under the flexible display panel. The film layer includes fine particles containing calcium carbonate overlapping the foldable area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
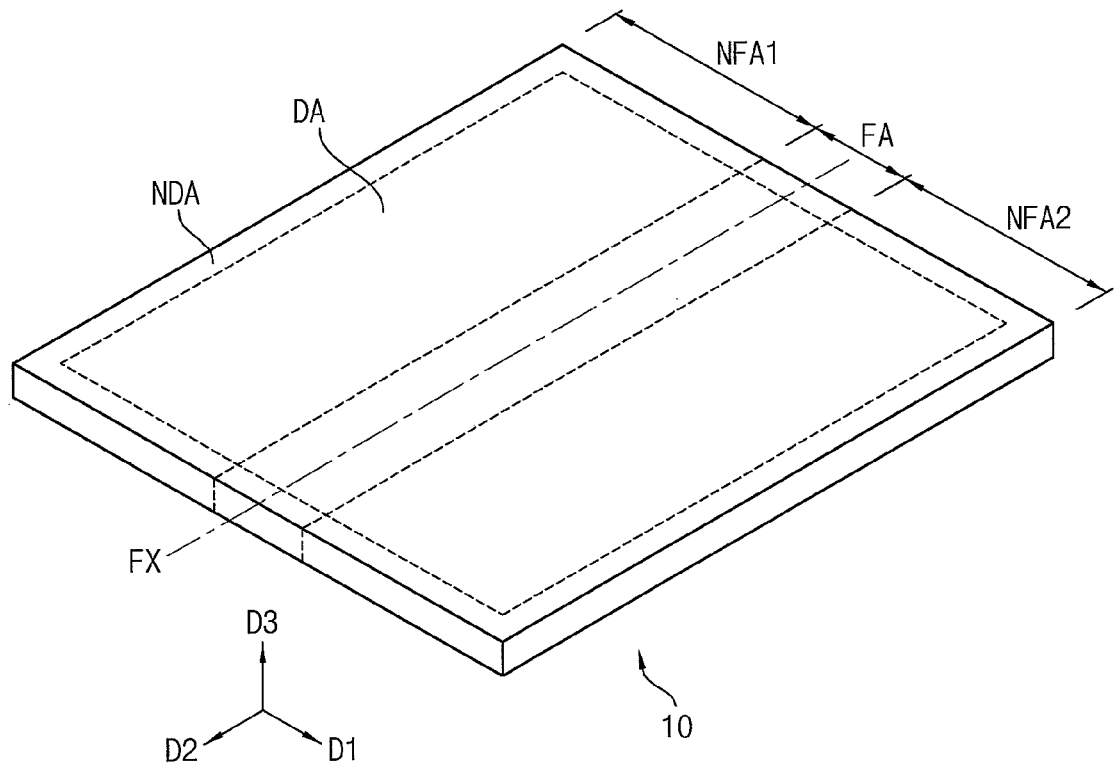
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
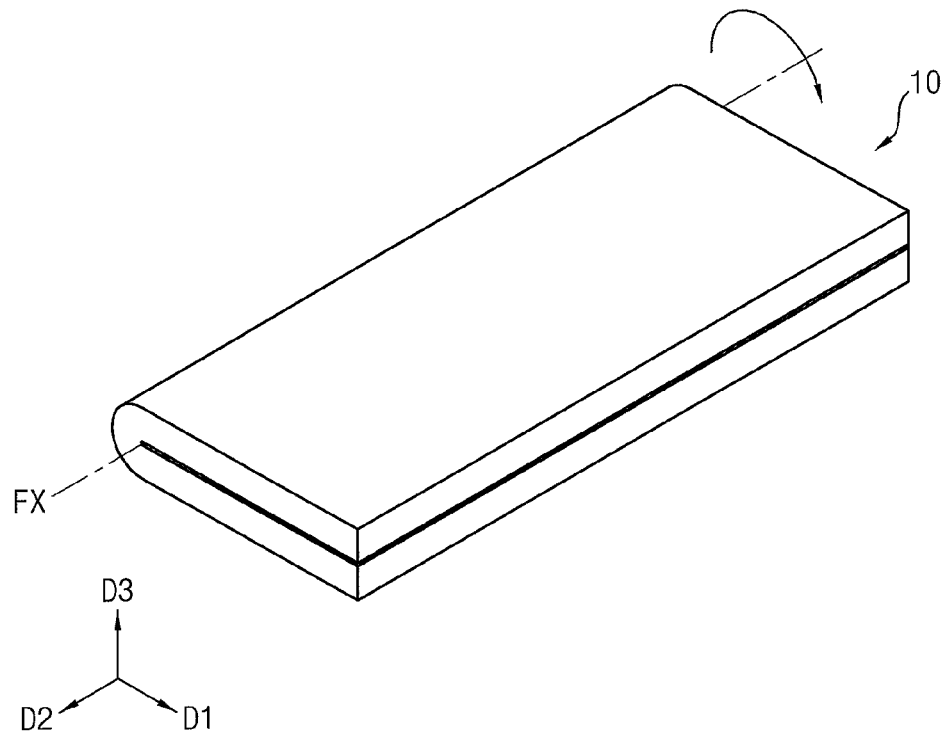
FIG. 2 is a perspective view of the display device of FIG. 1 in a folded position.

FIG. 1 is a perspective view of an exemplary embodiment of a display device constructed according to the principles of the invention. FIG. 2 is a perspective view of the display device of FIG. 1 in a folded position.

Referring to FIGS. 1 and 2, a foldable display is shown as an example of a display device 10. However, exemplary embodiments are not limited thereto. For example, the display device 10 may be applied to various display devices such as curved display devices, bendable display devices, rollable display devices, and stretchable display devices. In addition, the display device 10 may be used for small and medium-sized electronic apparatus such as mobile phones, personal computers, notebook computers, personal digital terminals, car navigation units, game machines, portable electronic apparatus, wrist watch-type electronic apparatus, and cameras, in addition to televisions or large-sized electronic apparatus such as external billboards.

The display device 10 may include a plurality of areas defined on a display surface. The display device 10 may include a display area DA and a non-display area NDA. The display area DA may be an area to display an image. The non-display area NDA may be an area adjacent to the display area DA. The non-display area NDA does not display an image. In an embodiment, the display area DA may have a substantially rectangular shape. The non-display area NDA may be adjacent to the display area DA and may surround the display area DA. In addition, the non-display area NDA may be omitted.

The display area DA of the display device 10 may be disposed substantially in parallel with a surface defined by a first direction D1 and a second direction D2 perpendicular to the first direction D1. A normal direction of the surface of the display device 10 is indicated by a third direction D3. The third direction D3 indicates the thickness direction of the display device 10.

The display device 10 may include a foldable area FA that can be folded about a foldable axis FX according to an action, and one or more adjacent non-foldable areas such as a first non-foldable area NFA1 and a second non-foldable area NFA2 that cannot be folded. The foldable axis FX may be in the same direction as the second direction D2. The first non-foldable area NFA1 and the second non-foldable area NFA2 may be disposed with the foldable area FA interposed therebetween. In other words, the first non-foldable area NFA1 may extend from one end of the foldable area FA in the first direction D1, and the second non-foldable area NFA2 may extend from the other end of the foldable area FA.

The foldable area FA may be folded about the foldable axis FX such that a display surface of the first non-foldable area NFA1 and a display surface of the second non-foldable area NFA2 face each other. In this case, a lower surface of the display device 10 may face upwardly.

As described above, the display device 10 may be folded about the foldable axis FX inwardly, such that the display surface of the first non-foldable area NFA1 and the display surface of the second non-foldable area NFA2 may face each other, which is defined as an inner folding. The display device 10 may also be folded about the foldable axis FX outwardly, such that the display surface of the first non-foldable area NFA1 and the display surface of the second non-foldable area NFA2 may face opposite directions, which is defined as an outer folding.

Figure 3:
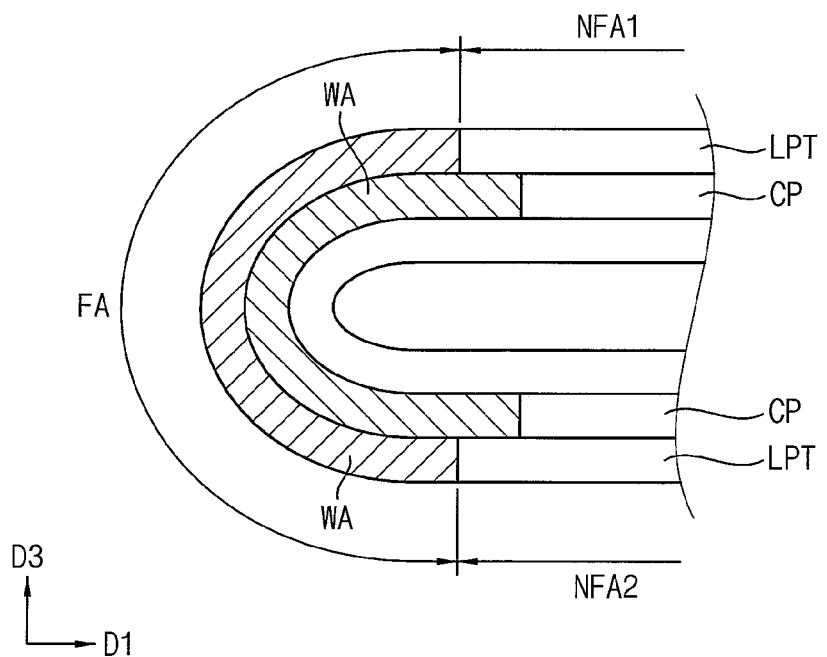
FIG. 3 is a cross-sectional view of an exemplary embodiment of a foldable area and adjacent non-foldable areas in the display device of FIG. 2.
Figure 4:
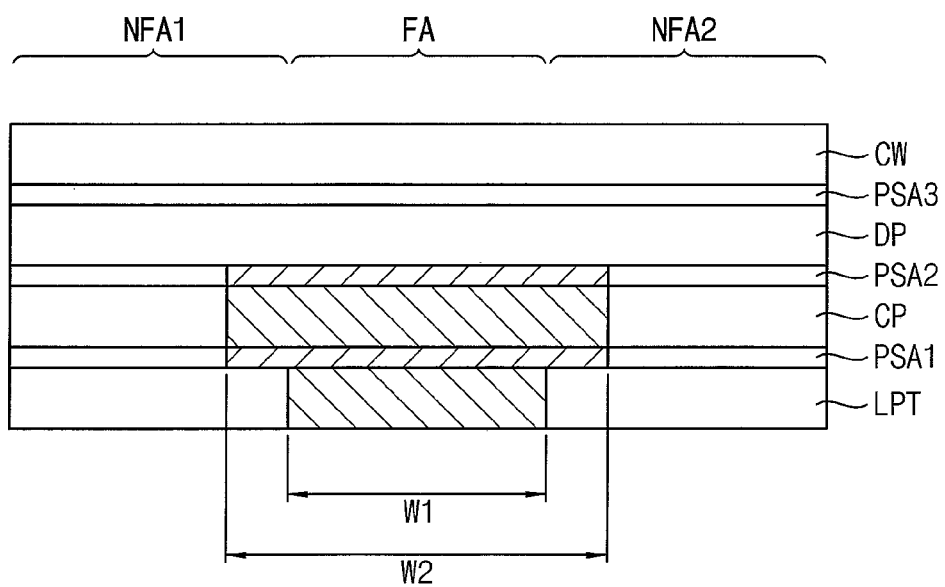
FIG. 4 is a cross-sectional view of the foldable area and the adjacent non-foldable areas in the display device of FIG. 3 in an unfolded position.
Figure 5A:
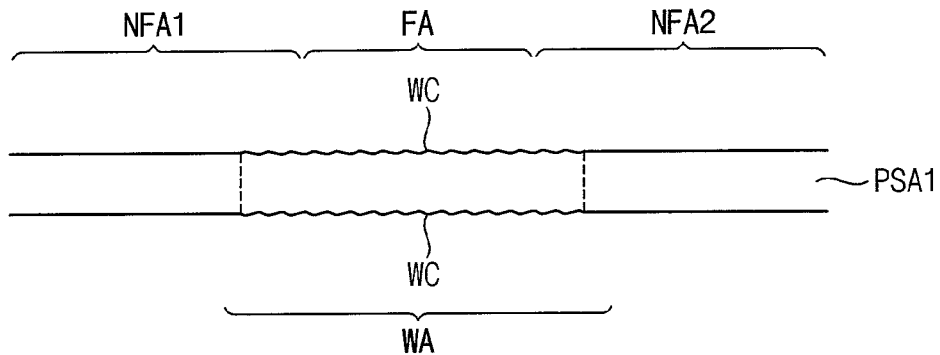
FIG. 5A is a cross-sectional view of an exemplary embodiment of the first adhesive layer of FIG. 4.
Figure 5B:
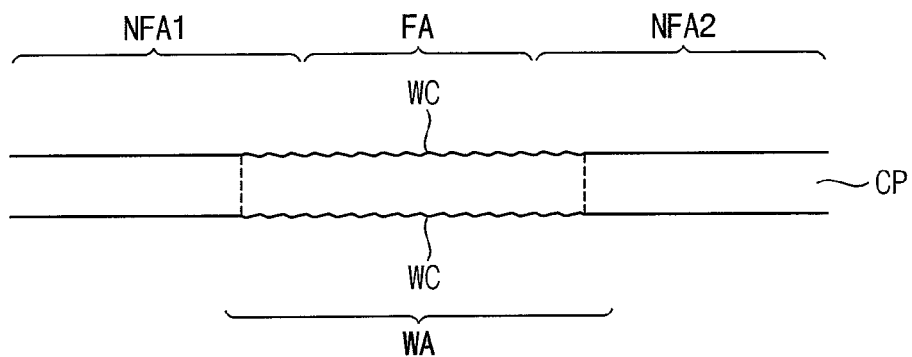
FIG. 5B is a cross-sectional view of an exemplary embodiment of the cushion panel of FIG. 4.
Figure 5C:
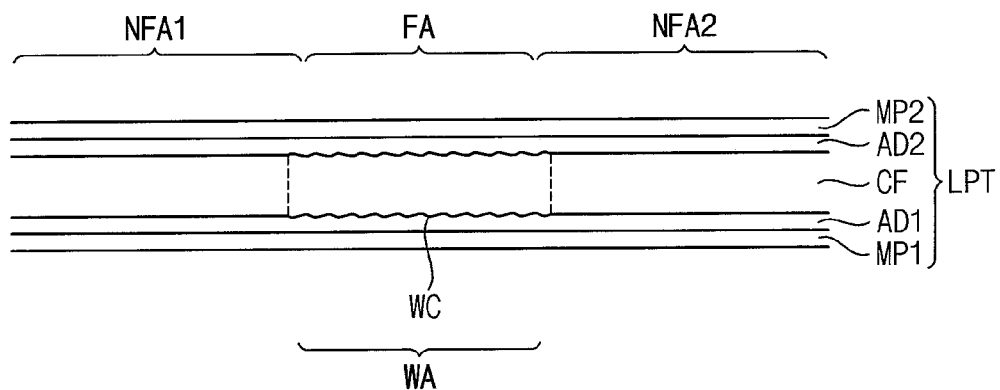
FIG. 5C is a cross-sectional view of an exemplary embodiment of the lower plate of FIG. 4.

FIG. 3 is a cross-sectional view of an exemplary embodiment of a foldable area and adjacent non-foldable areas in the display device of FIG. 2. FIG. 4 is a cross-sectional view of the foldable area and the adjacent non-foldable areas in the display device of FIG. 3 in an unfolded position. FIG. 5A is a cross-sectional view of an exemplary embodiment of the first adhesive layer of FIG. 4. FIG. 5B is a cross-sectional view of an exemplary embodiment of the cushion panel of FIG. 4. FIG. 5C is a cross-sectional view of an exemplary embodiment of the lower plate of FIG. 4.

Referring to FIGS. 3 to 5C, a display device may include a support member, which may be in the form of a lower plate LPT, a first adhesive layer PSA1, a buffer member, which may be in the form of a cushion panel CP, a second adhesive layer PSA2, a display panel DP, a third adhesive layer PSA3, and a cover window CW.

The lower plate LPT may be substantially rigid to support components of the display device, and may be configured to dissipate heat generated from some of the components of the display device, such as the display panel DP. The lower plate LPT may include a first metal layer MP1, a lower adhesive layer AD1, a film layer CF, an upper adhesive layer AD2, and a second metal layer MP2 as shown in FIG. 5C.

The first metal layer MP1 may be a metal plate. The metal plate may include a high modulus material. For example, the first metal layer MP1 may include at least one selected from the group consisting of Invar, Nobinite, stainless, and an alloy thereof, but is not limited thereto.

The lower adhesive layer AD1 may be disposed on the first metal layer MP1. The first metal layer MP1 and the film layer CF may be attached to each other by the lower adhesive layer AD1. The lower adhesive layer AD1 may include a pressure sensitive adhesive (PSA) as a main component. The pressure sensitive adhesive may be at least one selected from the group consisting of acrylic-based, silicone-based, polyester-based, rubber-based and polyurethane-based polymer, but is not limited thereto.

In an exemplary embodiment, the pressure sensitive adhesive may include acrylic copolymer formed by copolymerizing acrylic-based compound with other monomers. The acrylic-based compound may include acrylic monomer having 1 to 18 carbons, and more particularly, may include methyl (meth) acrylate, ethyl (meth) acrylate, propyl (meth) acrylate, n-butyl (meth) acrylate, isobutyl (meth) acrylate, 2-ethylhexyl (meth) acrylate, n-octyl (meth) acrylate, isooctyl (meth) acrylate, lauryl (meth) acrylate, stearyl (meth) acrylate, isononyl (meth) acrylate, cyclohexyl (meth) acrylate, benzyl (meth) acrylate, methoxyethyl (meth) acrylate, ethoxyethyl (meth) acrylate, phenoxyethyl (meth) acrylate, and the like, but is not limited thereto. The other monomers copolymerized with the acrylic-based compound may include styrene-based monomers, olefin-based monomers, vinyl esters, cyano group-containing monomers, amide group-containing monomers, hydroxyl group-containing monomers, acidic group-containing monomers, epoxy group-containing monomers, amino group-containing monomers, carboxyl group-containing monomers, and the like, but it is not limited thereto.

The film layer CF may be disposed on the lower adhesive layer AD1. The film layer CF may include an area containing at least one discontinuity, which could be in the form of an area of unevenness to facilitate bending such as a wrinkled area WA in which a wrinkle WC is formed on a surface of the film layer CF. The wrinkled area WA of the film layer CF may be formed to have a first width W1 substantially equal to the width of the foldable area FA. The wrinkle WC may be formed on both top and bottom surfaces of the film layer CF. For example, the wrinkle WC may be formed in an undulating concave-convex shape on the surfaces.

The film layer CF may have conductivity. When the film layer CF has the conductivity, an advantageous heat dissipation structure may be implemented in which heat generated from the display panel DP is discharged and/or dissipated to the outside. For example, the film layer CF may be formed of a resin layer including conductive balls. In some exemplary embodiments, the film layer CF may be formed of an insulating layer having no conductivity.

The upper adhesive layer AD2 may be disposed on the film layer CF. The second metal layer MP2 and the film layer CF may be attached to each other by the upper adhesive layer AD2. The upper adhesive layer AD2 may include a pressure sensitive adhesive (PSA) as a main component. The pressure sensitive adhesive may be at least one selected from the group consisting of acrylic-based, silicone-based, polyester-based, rubber-based and polyurethane-based polymer, but is not limited thereto.

The second metal layer MP2 may be disposed on the upper adhesive layer AD2. The second metal layer MP2 may be a metal plate. The metal plate may include a high modulus material. For example, the second metal layer MP1 may include at least one selected from the group consisting of Invar, Nobinite, stainless, and an alloy thereof, but is not limited thereto.

The wrinkle WC of the wrinkled area WA of the film layer CF may allow the film layer CF to have a high strain rate. Accordingly, when the foldable area FA of the lower plate LPT is bent and/or folded, the shear stress can be reduced at interlayer interfaces, and adhesion delamination, wrinkle deformation, bubble generation, or the like caused by a repulsive force due to the difference of curvatures of the interlayer interfaces can be prevented or at least reduced.

Other layers disposed below the display panel DP may also include uneven areas, such as wrinkled areas. The first adhesive layer PSA1 may be disposed on the lower plate LPT. The first adhesive layer PSA1 may include a pressure sensitive adhesive (PSA) as a main component. The pressure sensitive adhesive may be at least one selected from the group consisting of acrylic-based, silicone-based, polyester-based, rubber-based and polyurethane-based polymer, but is not limited thereto.

The first adhesive layer PSA1 may include a wrinkled area WA in which a wrinkle WC is formed on a surface of the first adhesive layer PSA1 as shown in FIG. 5A. The wrinkle WC of the first adhesive layer PSA1 may be formed to have a second width W2 greater than the first width W1 as shown in FIG. 4. A part of the wrinkled area WA of the first adhesive layer PSA1 may overlap the first and second non-foldable areas NFA1 and NFA2. As such, the wrinkled area WA of the first adhesive layer PSA1 may overlap the foldable area FA and the first and second non-foldable area NFA1 and NFA2.

The cushion panel CP may be disposed on the first adhesive layer PSA1. The cushion panel CP may be disposed between the lower plate LPT and the display panel DP and may serve to protect the display panel DP from an external shock. The cushion panel CP may be formed of a material having excellent compressive stress and having excellent absorption of shock and vibration. For example, the cushion panel CP may be formed of acrylic-based resin, polyurethane or latex, but is not limited thereto.

The cushion panel CP may include a wrinkled area WA in which a wrinkle WC is formed on a surface of the cushion panel CP as shown in FIG. 5B. The wrinkle WC of the cushion panel CP may be formed to have the second width W2. A part of the wrinkled area WA of the cushion panel CP may overlap the first and second non-foldable areas NFA1 and NFA2. As such, the wrinkled area WA of the cushion panel CP may overlap the foldable area FA and the first and second non-foldable area NFA1 and NFA2.

The second adhesive layer PSA2 may be disposed on the cushion panel CP. The second adhesive layer PSA2 may include a pressure sensitive adhesive (PSA) as a main component. The pressure sensitive adhesive may be at least one selected from the group consisting of acrylic-based, silicone-based, polyester-based, rubber-based and polyurethane-based polymer, but is not limited thereto.

The second adhesive layer PSA2 may be configured in substantially the same way as the first adhesive layer PSA1. The second adhesive layer PSA2 may include a wrinkled area in which a wrinkle is formed on a surface of the wrinkled area. The wrinkle area of the second adhesive layer PSA2 may be formed to have the second width W2 greater than the first width W1. A part of the wrinkled area of the second adhesive layer PSA2 may overlap the first and second non-foldable areas NFA1 and NFA2.

In FIGS. 3 and 4, the shaded portions may be the wrinkled areas in which a wrinkle may be formed on at least one surface of each layer.

The display panel DP may be a flexible display panel. The display panel DP may include a foldable area vertically overlapping the foldable area FA of the display device 10. For example, the display panel DP includes non-foldable areas and the foldable area disposed between the non-foldable areas, the non-foldable areas and the foldable area corresponding to the first and second non-foldable areas NFA1 and NFA2 and the foldable area FA, respectively. The display panel DP may be a flexible organic light emitting display device including a base layer, a display element disposed on the base layer, and an encapsulation layer disposed on the display element. The display element may include a first electrode, a light emitting layer, and a second electrode.

The third adhesive layer PSA3 may be disposed on the display panel DP. The third adhesive layer PSA3 may include a pressure sensitive adhesive (PSA) as a main component. The pressure sensitive adhesive may be at least one selected from the group consisting of acrylic-based, silicone-based, polyester-based, rubber-based and polyurethane-based polymer, but is not limited thereto.

The cover window CW may be disposed on the third adhesive layer PSA3. The cover window CW may be formed of a transparent hard material, so that the display panel DP may be protected from external shock while allowing an image of the display panel DP to pass through without any change.

According to a conventional foldable display device, since the metal plate cannot be readily folded, the metal plate is separately provided to be placed only in the non-foldable area, not in the foldable area. Accordingly, defects such as wrinkles and bubbles, and appearance defects (e.g., waviness) may be caused in the foldable area.

In exemplary embodiments, the foldable display device 10 includes layers including the wrinkled area having wrinkled surfaces so that the defects can be prevented or at least reduce. For example, the lower plate LPT includes the first and second metal layers MP1 and MP2 disposed in the foldable area FA as well as the non-foldable areas NFA1 and NFA2 to prevent the defects. The lower plate LPT may further include the film layer CF including the wrinkled area. The film layer CF including the wrinkled area has a relatively high strain rate, which may reduce a shear stress at interlayer interfaces of the layers of the lower plate LPT and/or the display device 10 and may prevent or at least reduce adhesion delamination, wrinkle deformation, bubble generation, or the like caused by repulsive force due to the difference of curvatures of the interlayer interfaces when the display device 10 is folded. Therefore, the lower plate LPT and/or the display device 10 facilitates folding and unfolding without causing the defects such as wrinkles and bubbles, and appearance defects. Further, the first and second adhesive layers PSA1 and PSA2 and the cushion panel CP may include the wrinkled areas having a relatively high strain rate, and these may also facilitate folding and unfolding of the lower plate LPT and/or the display device 10 without causing such defects. The display device 10 may be provided by applying a manufacturing method using a hydrogel. An exemplary method of manufacturing the display device 10 will be described subsequently.

A touch sensor configured to detect a user's touch action may be further disposed between the display panel 100 and the cover window CW. The touch sensor may be implemented on a separate substrate so as to be disposed on the display panel DP or may be directly implemented inside the display panel DP.

Figure 6A:
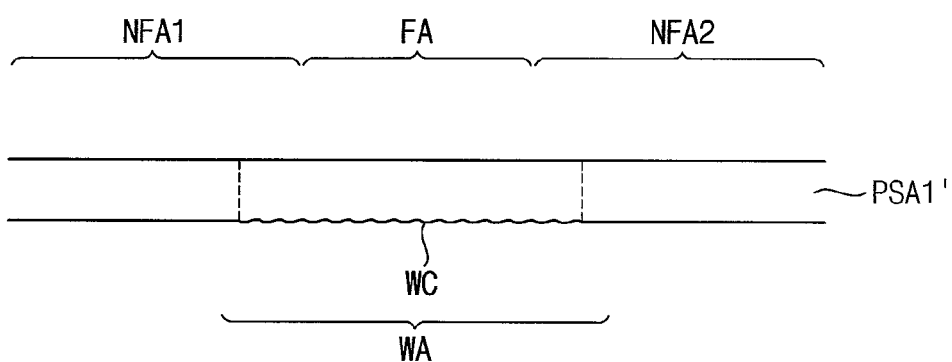
FIG. 6A is a cross-sectional view of another exemplary embodiment of the first adhesive layer of FIG. 4.
Figure 6B:
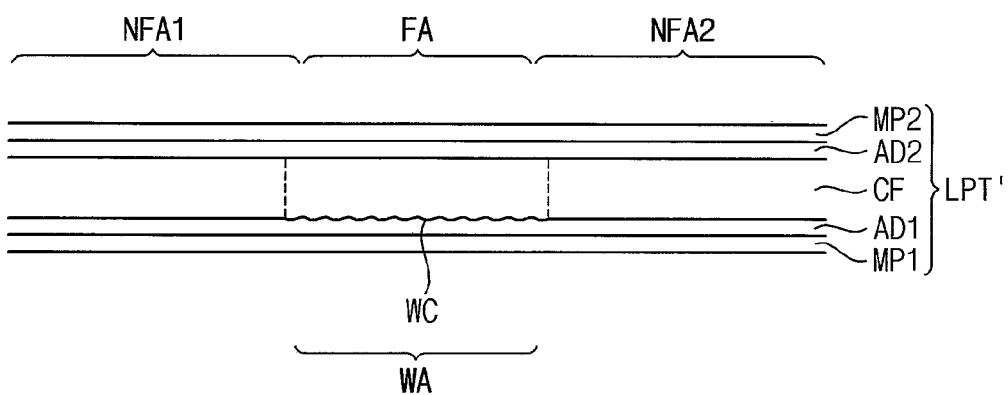
FIG. 6B is a cross-sectional view of another exemplary embodiment of the lower plate of FIG. 4.

FIG. 6A is a cross-sectional view of another exemplary embodiment of the first adhesive layer of FIG. 4. FIG. 6B is a cross-sectional view of another exemplary embodiment of the lower plate of FIG. 4.

Referring to FIGS. 6A and 6B, the first adhesive layer PSA1' and the lower plate LPT' are substantially the same as the first adhesive layer PSA1 and the lower plate LPT of FIGS. 5A and 5C, except for the wrinkled area WA formed therein with the wrinkles WC of each layer. Therefore, duplicate description related thereto will be omitted for conciseness.

In FIG. 6A, the first adhesive layer PSA1' may have a wrinkle WC in a wrinkled area WC only on the bottom surface of the first adhesive layer PSA1'. The second adhesive layer PSA2, the cushion panel CP, and/or other layers disposed below the display panel DP each may also have a wrinkle only on one side thereof. In addition, while the drawing shows that the wrinkle WC is formed on the bottom surface of the first adhesive layer PSA1', the wrinkle may be formed only on the top surface.

In FIG. 6B, a film layer CF of the lower plate LPT' may have a wrinkle WC in a wrinkled area WC only on the bottom surface of the film layer CF. While the drawing shows that the wrinkle WC is formed on the bottom surface of the film layer CF, the wrinkle may be formed only on the top surface.

Figure 7:
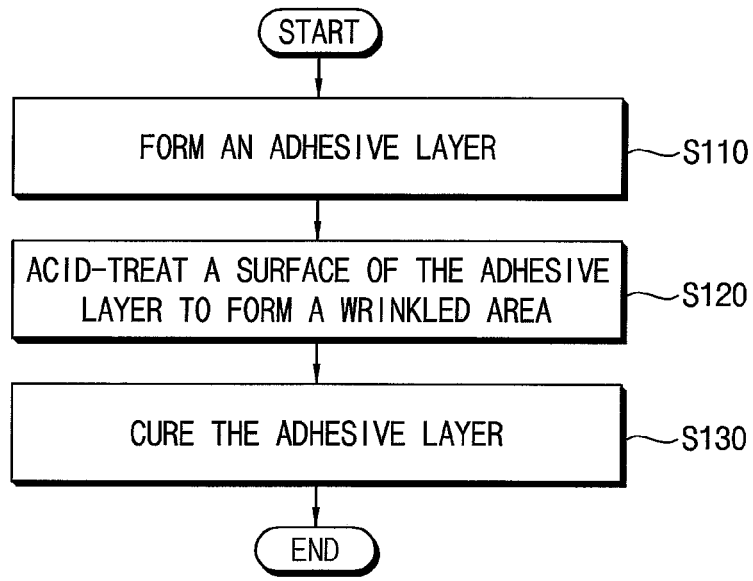
FIG. 7 is a flowchart of a method of manufacturing an adhesive layer for a display device according to the principles of the invention.

FIG. 7 is a flowchart of a method of manufacturing an adhesive layer for a display device according to the principles of the invention.

Referring to FIG. 7, a method of manufacturing an adhesive layer for a display device may include forming an adhesive layer (S110), acid-treating a surface of the adhesive layer to form a wrinkled area (S120), and curing the adhesive layer (S130).

At step S110, hydrophobic surface-treated fine particles having basicity may be mixed with a pressure-sensitive adhesive resin solution, so that the adhesive layer may be formed. The fine particles may include calcium carbonate ($CaCO_3$).

At step S120, an acidic solution may contact with the surface of the adhesive layer, thereby performing the acid treatment. Thus, the fine particles positioned adjacent to the surface of the adhesive layer may be removed, such that a wrinkled area may be formed in a region of the adhesive layer in which the fine particles are removed. The acidic solution may be dilute hydrochloric acid.

At step S130, the adhesive layer may be thermally cured. Accordingly, a wrinkle may be formed on the surface of the adhesive layer in the wrinkled area.

Specific details for forming the wrinkle will be described below with reference to FIG. 8.

The method of manufacturing the adhesive layer may be used to form the first adhesive layer PSA1 and the second adhesive layer PSA2 of the display devices of FIGS. 1 to 5C, and the cushion panel CP including a wrinkle may be manufactured by using a similar scheme.

Figure 8:
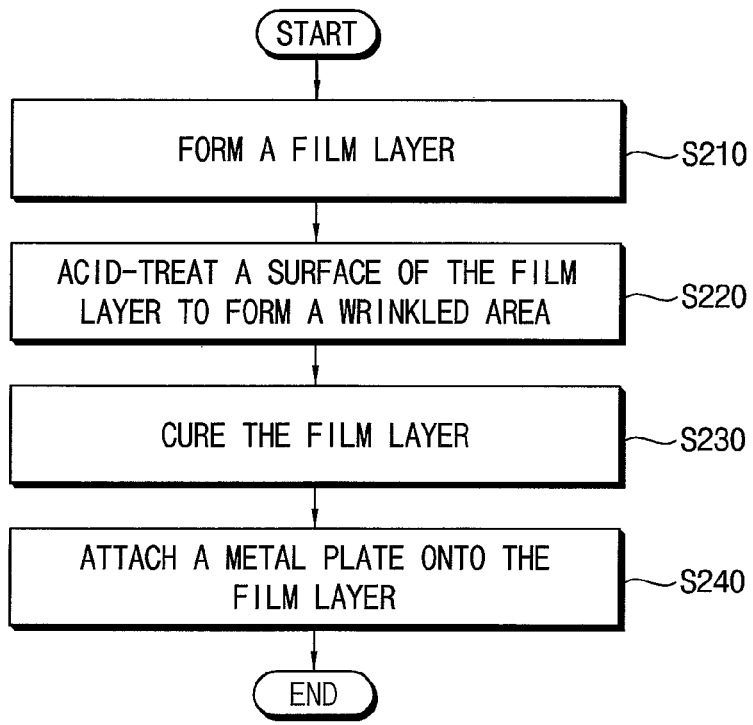
FIG. 8 is a flowchart of a method of manufacturing a lower plate for a display device according to the principles of the invention.

FIG. 8 is a flowchart of a method of manufacturing a lower plate for a display device according to the principles of the invention.

Referring to FIG. 8, the method of manufacturing a lower plate may include forming a film layer (S210), acid-treating a surface of the film layer to form a wrinkled area (S220), curing the film layer (230), and attaching a metal plate onto the film layer (S240).

At step S210, fine particles containing a hydrophobic surface-treated calcium carbonate may be mixed with a resin solution, so that the film layer may be formed. The calcium carbonate may have basicity. For example, the resin solution containing the fine particles may be coated on a base film, so that the film layer may be formed. The film layer may include a first portion disposed between second and third portions spaced apart from each other. The first portion may include the fine particles, and the film layer may be formed to prevent the fine particles from being contained in the second and third portions.

The fine particles may have an average size of about 0.1 μm (micrometer) or less. For example, the fine particles containing calcium carbonate ($CaCO_3$) have a size of about 0.03 μm. Since the fine particles may be dispersed unevenly due to precipitation or agglomeration when mixed with organic solution, a surface improvement is required to uniformly disperse the fine particles and maintain the performance of the material. For the surface improvement, the fine particles may be hydrophobic surface-treated. For example, for the surface improvement of the fine particles containing calcium carbonate, ethanol:calcium carbonate ($CaCO_3$):stearic acid may be mixed at the ratio of 10:1:0.4, so that hydrophobicity may be provided to the surfaces of the fine particle. Accordingly, upon mixture with the resin solution to form the film layer CF, the fine particles containing calcium carbonate ($CaCO_3$) may have a uniform distribution.

For example, in a case where stearic acid is added, when the surfaces of the fine particles are surface-treated by about 25%, a contact angle of water with respect to the surface of the fine particle containing calcium carbonate ($CaCO_3$) may be 48°, and when the surfaces of the fine particles are surface-treated by about 50%, the contact angle may be more than 100°, so that the surface of the fine particle including calcium carbonate ($CaCO_3$) may be modified to be hydrophobic.

In an exemplary embodiment, the resin solution may include conductive balls, and thus the film layer may have conductivity.

At step S220, an acidic solution may contact with the surface of the film layer to perform the acid treatment. Accordingly, the fine particles positioned adjacent to the surface of the film layer may be removed, such that a wrinkled area may be formed in a region of the film layer in which the fine particles are removed. The first portion of the film layer including the fine particles may form the wrinkled area, and the second and third portions of the film layer including no fine particle may form substantially flat areas. For example, the film layer may be immersed into the acidic solution to perform the acid treatment. For example, the fine particles containing calcium carbonate having high solubility in acid may be removed by using 0.1 mol/L of aqueous hydrochloric acid (HCl). Accordingly, voids may be formed on the surface of the film layer in the wrinkled area.

At step S230, the film layer may be thermally cured. The film layer may be thermally cured at a temperature of more than about 100° C. For example, the film layer may be cured through a hard bake process at a temperature of about 220° C. for an hour. Accordingly, the wrinkle may be formed on the surface of the film layer, so that the wrinkled area may be formed.

When the film layer is folded, the formed wrinkle may improve the strain rate by the height of the wrinkle. When assuming that the height of the film layer is about 100 μm, and when a wrinkle is generated by uniformly removing fine particles containing calcium carbonate until a depth of about 10 μm from the surface of the film layer, which is about 10% of the height of the film layer, by immersing the film layer containing the fine particles into the diluted hydrochloric acid solution for several minutes, the strain rate may be improved by about 10%.

The fine particles containing calcium carbonate may be distributed only in the wrinkle area and may not be distributed in the flat area. In this case, when the acid treatment is performed, the wrinkle may be formed only in the wrinkle area even when the entire film layer is treated by the acidic solution.

In another exemplary embodiment, the fine particles containing calcium carbonate may be distributed over the entire film layer. In this case, when the acid treatment is performed, only the wrinkled area of the film layer may be treated by the acidic solution.

At step S240, metal plates may be attached onto the top and bottom surfaces of the film layer. The metal plate and the film layer may be attached to each other using the adhesive layer.

Figure 9:
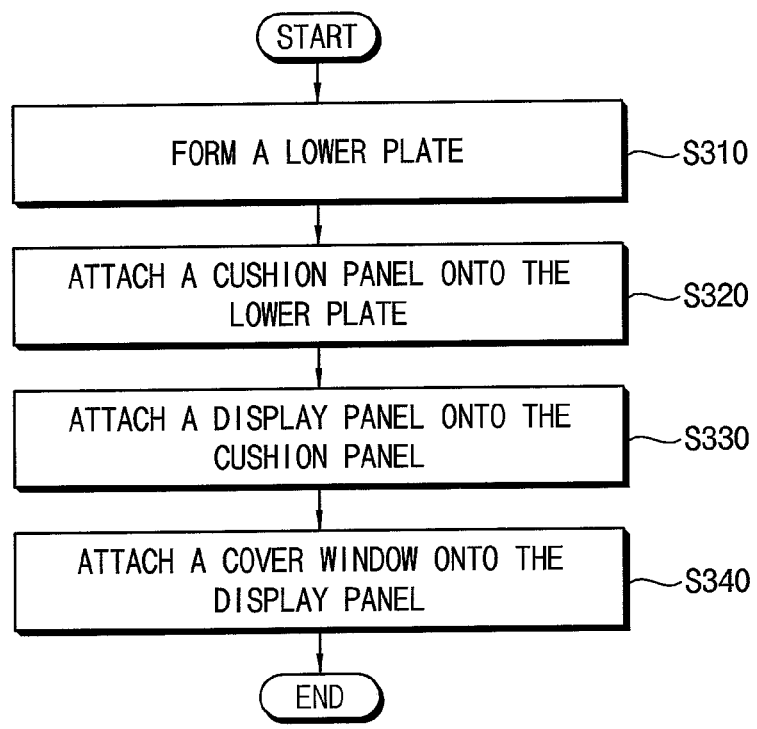
FIG. 9 is a flowchart of a method of manufacturing a display device according to the principles of the invention.

FIG. 9 is a flowchart of a method of manufacturing a display device according to the principles of the invention.

Referring to FIG. 9, the method of manufacturing a display device may include forming a lower plate (S310), attaching a cushion panel onto the lower plate (320), attaching a display panel onto a cushion panel (330), and attaching a cover window onto the display panel (340).

At step S310, the lower plate may be formed through the method described in FIG. 8.

At step 320, the cushion panel may be attached onto the lower plate by using the adhesive layer. The cushion panel may be formed through the method described in FIG. 7.

At step S330, the display panel may be attached onto the cushion panel by using the adhesive layer. The display panel may be a flexible display panel and may be formed by using various known techniques.

At step S340, the cover window may be attached onto the display panel by using the adhesive layer. Therefore, the manufacture of the display device may be complete.

Figure 10A:
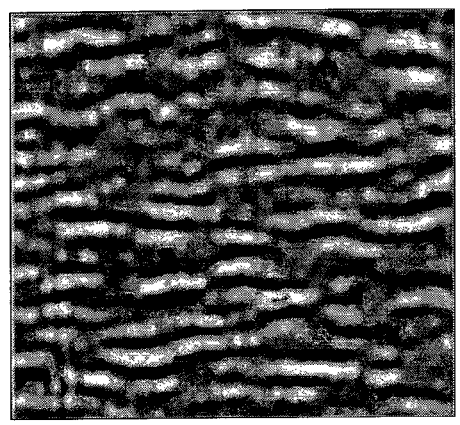
FIGS. 10A and 10B are diagrams illustrating examples of the surface of a wrinkle area of a display device made according to the principles of the invention.
Figure 10B:
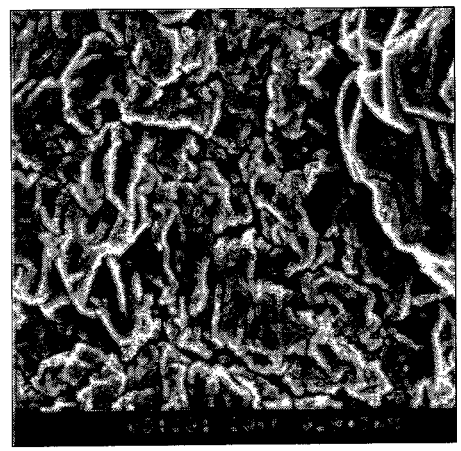

FIGS. 10A and 10B are diagrams illustrating examples of the surface of a wrinkle area of a display device made according to the principles of the invention.

FIGS. 10A and 10B show results observed with scanning electron microscope (SEM) on the wrinkled surface of the film layer of the lower plate of the display device. Holes, slits, and/or grooves formed by removing calcium carbonate ($CaCO_3$) using the diluted hydrochloric acid solution were thermally dried and became wrinkles, so that a new film structure having increased elastic strain rate was generated.

Figure 11:
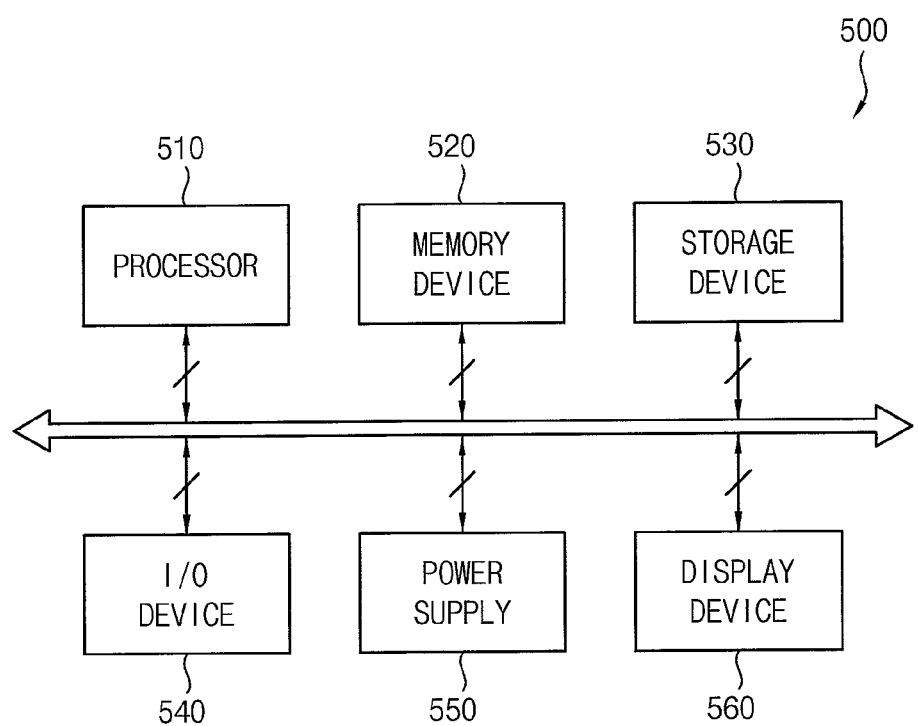
FIG. 11 is a block diagram of an exemplary embodiment of an electronic apparatus including a display device constructed according to the principles of the invention.

FIG. 11 is a block diagram of an exemplary embodiment of an electronic apparatus including a display device constructed according to the principles of the invention.

Referring to FIG. 11, an electronic apparatus 500 may include a processor 510, a memory device 520, a storage device 530, an input/output (I/O) device 540, a power supply 550, and a display device 560. Here, the display device 560 may be the display device 10 of FIG. 1. In addition, the electronic apparatus 500 may further include a plurality of ports for communicating with a video card, a sound card, a memory card, a universal serial bus (USB) device, other electronic apparatus, etc. In an exemplary embodiment, the electronic apparatus 500 may be implemented as a television. In another exemplary embodiment, the electronic apparatus 500 may be implemented as a smart phone. However, the electronic apparatus 500 is not limited thereto. For example, the electronic apparatus 500 may be implemented as a cellular phone, a video phone, a smart pad, a smart watch, a tablet PC, a car navigation system, a computer monitor, a laptop, a head mounted display (HMD) device, etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic apparatus 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc., and an output device such as a printer, a speaker, etc. The power supply 550 may provide power for operations of the electronic apparatus 500.

The display device 560 may be coupled to other components via the buses or other communication links. In some exemplary embodiments, the I/O device 540 may include the display device 560. As described above, since the display device 560 includes a layer including the wrinkle area in the foldable area, the layer may have a high strain rate. Accordingly, when the display device 560 is folded and unfolded, the shear stress may be reduced at interlayer interfaces, and adhesion delamination, wrinkle deformation, bubble generation, or the like caused by a repulsive force due to the difference of curvatures of the interlayer interfaces may be prevented or at least reduced. Since these are described above, duplicated description related thereto will be omitted for conciseness.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device having a first non-foldable area, a second non-foldable area spaced apart from the first non-foldable area, and a foldable area disposed between the first non-foldable area and the second non-foldable area, the display device comprising:
   a support member;
   a first adhesive layer disposed on the support member;
   a buffer member disposed on the first adhesive layer;
   a second adhesive layer disposed on the buffer member; and
   a flexible display panel disposed on the second adhesive layer,
   wherein at least one of the support member and the buffer member includes a first area overlapping the foldable area having at least one first uneven area to facilitate bending, the at least one first uneven area being formed on a surface of the first area.

2. The display device of claim 1, wherein the support member comprises a lower plate including:
   a first metal layer;
   a film layer disposed on the first metal layer, the film layer including the first area; and
   a second metal layer disposed on the film layer.

3. The display device of claim 2, wherein:
   the buffer member comprises a cushion panel including a second area overlapping the foldable area, the second area having at least one second uneven area to facilitate bending;
   the first area has a first width; and
   the second area has a second width greater than the first width.

4. The display device of claim 3, wherein the first and second areas comprise first and second wrinkled areas having wrinkles formed on a surface of the film layer and the cushion panel, respectively, and the second area of the cushion panel partially overlaps the first and second non-foldable areas.

5. The display device of claim 2, wherein the lower plate further comprises:
   a lower adhesive layer disposed between the first metal layer and the film layer; and
   an upper adhesive layer disposed between the film layer and the second metal layer.

6. The display device of claim 1, wherein the support member includes a film layer including the first area, and the film layer of the support member comprises a resin layer having a conductive ball.

7. The display device of claim 1, wherein the first area comprises a wrinkled area having wrinkles formed on top and bottom surfaces thereof.

8. The display device of claim 1, wherein the first and second adhesive layers include third and fourth areas overlapping the foldable area, at least one of the third and fourth areas having at least one uneven area to facilitate folding.

9. The display device of claim 1, wherein the first area comprises fine particles containing calcium carbonate.

10. A method of manufacturing a display device, the method comprising steps of:
    forming a film layer by using a resin solution containing fine particles having basicity;
    performing an acid-treatment to remove some of the fine particles adjacent to a surface of the film layer by allowing an acidic solution to contact the film layer;

forming a wrinkle on the surface of the film layer by curing the acid-treated film layer; and attaching a display panel onto the film layer having the wrinkle.

11. The method of claim 10, wherein the fine particles contain calcium carbonate ($CaCO_3$).

12. The method of claim 11, wherein surfaces of the fine particles are subject to a hydrophobic treatment.

13. The method of claim 12, wherein the hydrophobic treatment is performed by mixing the fine particles containing the calcium carbonate ($CaCO_3$) with ethanol and stearic acid.

14. The method of claim 11, wherein the acidic solution includes dilute hydrochloric acid.

15. The method of claim 10, wherein the film layer is thermally cured at a temperature of more than about 100° C. when the acid-treated film layer is cured.

16. The method of claim 10, wherein the fine particles have an average size of less than about 0.1 μm.

17. The method of claim 10, further comprising the step of:

attaching a metal plate onto the film layer before the display panel is attached onto the film layer.

18. The method of claim 17, further comprising the step of:

attaching a cushion panel onto the metal plate before the display panel is attached onto the film layer.

19. The method of claim 10, wherein the film layer comprises a wrinkled area having the wrinkle and flat areas spaced apart from each other, and the wrinkled area is formed between the flat areas.

20. A display device comprising:

a flexible display panel having a foldable area; and a film layer disposed under the flexible display panel, wherein the film layer includes fine particles containing calcium carbonate overlapping the foldable area.

* * * * *